(12) United States Patent
Chu

(10) Patent No.: US 8,033,720 B2
(45) Date of Patent: Oct. 11, 2011

(54) TEMPERATURE SENSING CIRCUIT AND SEMICONDUCTOR MEMORY DEVICE USING THE SAME

(75) Inventor: Gyo Soo Chu, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 679 days.

(21) Appl. No.: 12/005,678

(22) Filed: Dec. 28, 2007

(65) Prior Publication Data

US 2008/0291969 A1 Nov. 27, 2008

(30) Foreign Application Priority Data

May 21, 2007 (KR) .................. 10-2007-0049358

(51) Int. Cl.
*G01K 7/00* (2006.01)
*G01K 7/14* (2006.01)
*G11C 7/04* (2006.01)

(52) U.S. Cl. ........ 374/178; 327/513; 702/130; 374/171; 365/189.11

(58) Field of Classification Search .................. 374/100, 374/163, 141, 183, 185, 179, 178, 170–173, 374/1; 327/512–513, 539, 524, 578; 702/130–136, 702/99; 365/200, 189.09, 189.11
See application file for complete search history.

(56) References Cited

U.S. PATENT DOCUMENTS

| | | | | |
|---|---|---|---|---|
| 3,703,651 A * | 11/1972 | Blowers | .................. | 327/513 |
| 3,813,565 A * | 5/1974 | Guilleux | .................. | 327/509 |
| 3,851,191 A * | 11/1974 | Deebel et al. | ............ | 340/870.17 |
| 3,878,502 A * | 4/1975 | Rochelle | ........................ | 367/134 |
| 4,010,486 A * | 3/1977 | Suzuki | .......................... | 257/423 |
| 4,060,715 A * | 11/1977 | Scott | .............................. | 702/133 |
| 4,138,616 A * | 2/1979 | Turner | ......................... | 327/512 |
| 4,229,753 A * | 10/1980 | Bergeron et al. | ............ | 257/469 |
| 4,652,144 A * | 3/1987 | Gunther et al. | ................ | 327/512 |
| 4,795,918 A * | 1/1989 | Menon et al. | ................. | 327/539 |
| 4,887,181 A * | 12/1989 | Lenz | .............................. | 361/103 |
| 5,213,416 A * | 5/1993 | Neely et al. | .................... | 374/178 |
| 5,619,430 A * | 4/1997 | Nolan et al. | .................... | 702/63 |
| 5,795,069 A * | 8/1998 | Mattes et al. | ................. | 374/183 |
| 6,037,832 A * | 3/2000 | Kaminishi | .................... | 327/538 |
| 6,232,828 B1* | 5/2001 | Smith et al. | .................... | 327/539 |
| 6,396,231 B1* | 5/2002 | Horng et al. | ................... | 318/471 |
| 6,407,525 B1* | 6/2002 | Horng et al. | ................... | 318/473 |
| 6,667,925 B2* | 12/2003 | Kobayashi et al. | ........... | 365/211 |
| 6,724,196 B1* | 4/2004 | Chiaro et al. | ................... | 324/609 |
| 7,524,108 B2* | 4/2009 | Yoshida et al. | ............... | 374/178 |
| 7,750,728 B2* | 7/2010 | Marinca | ........................ | 327/539 |
| 2006/0267127 A1* | 11/2006 | Kim | ............................... | 257/467 |
| 2007/0159237 A1 | 7/2007 | Zimlich | | |
| 2007/0229120 A1* | 10/2007 | Okajima et al. | .............. | 327/100 |

(Continued)

FOREIGN PATENT DOCUMENTS

KR 10-2005-0033913 4/2005

(Continued)

*Primary Examiner* — Gail Verbitsky
(74) *Attorney, Agent, or Firm* — John P. White; Cooper & Dunham LLP

(57) ABSTRACT

A temperature sensing circuit comprises a temperature sensing unit for generating a reference voltage having a constant level, regardless of a temperature fluctuation, and a variable voltage to be changed according to the temperature fluctuation, and a comparison unit for comparing the reference voltage to the variable voltage, detecting an ambient temperature and generating a temperature detecting signal.

10 Claims, 9 Drawing Sheets

U.S. PATENT DOCUMENTS

| | | | |
|---|---|---|---|
| 2007/0280330 A1* | 12/2007 | Jeong et al. | 374/141 |
| 2009/0091311 A1* | 4/2009 | Kang | 323/313 |
| 2010/0134180 A1* | 6/2010 | Smith et al. | 327/539 |
| 2010/0315157 A1* | 12/2010 | Na et al. | 327/539 |
| 2011/0080207 A1* | 4/2011 | Ball | 327/512 |

FOREIGN PATENT DOCUMENTS

| | | |
|---|---|---|
| KR | 1020050031675 A | 4/2005 |
| KR | 10-2005-0096686 | 10/2005 |
| KR | 10-2006-0087886 | 8/2006 |

* cited by examiner (A)

(B)

TEMPERATURE SENSING CIRCUIT AND SEMICONDUCTOR MEMORY DEVICE USING THE SAME

BACKGROUND

The present disclosure relates to a semiconductor memory device, and more particularly to a temperature sensing circuit capable of reducing size and current consumption and a semiconductor memory device using the same.

Generally, a volatile semiconductor memory device such as a DRAM (Dynamic Random Access Memory) is embedded in a high-speed electric system such as a personal computer and an electronic communication system and has been developed with high integration and capacity. In case of a semiconductor memory device which is embedded into a battery-operated system such as a cellular phone and a notebook computer, since a low current consumption characteristic is desperately needed, studies to reduce an operating or standby current have been steadily conducted.

A data retention characteristic of a DRAM memory cell having one transistor and one storage capacitor is very sensitive according to a temperature. Thus, it may be necessary to control an operational condition of circuit blocks according to fluctuation of the ambient temperature of a semiconductor integrated circuit. For example, in case of the DRAM used for a mobile product, a refresh period is controlled according to fluctuation of the ambient temperature. A temperature sensor, such as a DTSR (digital temperature sensor regulator) and an ATSR (analog temperature sensor regulator), is used for controlling an operational condition according to fluctuation of the ambient temperature. Such a temperature sensor performs a few operations to sense a high temperature, control an operational period to reduce current consumption in a self refresh mode and monitor the ambient temperature in a normal operation.

Meanwhile, there are semiconductor memory devices which only need to sense the high temperature among the above-mentioned operations of the temperature sensor. For example, in case of an ECC (error correction code) mobile DRAM, the only information which is monitored is whether the ambient temperature is high (about 85° C. prescribed in the specification) or not. However, conventional temperature sensors which are large in size and consume much current due to the many operational amplifiers are not appropriate for a semiconductor memory device. In this regard, there is a need for a temperature sensor, which has the function to sense the high temperature, for reduction of the size and current consumption in the semiconductor memory device.

SUMMARY

In an aspect of the present disclosure, a temperature sensing circuit comprises a temperature sensing unit for generating a reference voltage having a constant level, regardless of a temperature fluctuation, and a variable voltage to be changed according to the temperature fluctuation, and a comparison unit for comparing the reference voltage to the variable voltage, detecting an ambient temperature and generating a temperature detecting signal.

Various embodiments and examples of such a temperature sensing circuit are possible.

For example, the temperature sensing unit can include a reference voltage generating unit for dividing a driving voltage and generating the reference voltage, a control voltage generating unit for generating a first voltage in response to the reference voltage, and an amplifying unit for generating the variable voltage in response to the first voltage. The reference voltage generating unit can include a plurality of voltage dividing elements in series connected between a terminal for receiving the driving voltage and a first node. The voltage dividing elements can be resistance elements. The reference voltage generating unit can include an enable element connected between the first node and a ground voltage level in order to enable an operation of the voltage dividing elements in response to a first enable signal.

The control voltage generating unit can include a first level controlling element connected between the driving voltage supply terminal and a second node, and a first temperature element connected between the first node and the second node, to generate the first voltage in response to the reference voltage. The first level controlling element can be a resistance element or a transistor. The first temperature element can be a transistor.

The amplifying unit can include a second level controlling element connected between the driving voltage supply terminal and a third node and a second temperature element connected between the first node and the third node to generate the variable voltage in response to the first voltage. The second level controlling element can be a resistance element or a transistor. The second temperature element can be a transistor which operates in a subthreshold voltage section in response to the first voltage. The amplifying unit can include a second level controlling element connected between the terminal for receiving the driving voltage and a third node, a second temperature element connected between the first node and the third node and generating a second voltage in response to the first voltage, a third level controlling element connected between the driving voltage supply terminal and a fourth node, and a second temperature element connected between the first node and the fourth node to generate the variable voltage in response to the second voltage. The second level controlling element can be a resistance element or a transistor and the third level controlling element can be a resistance element or a transistor. The second temperature element can be a transistor which operates in a subthreshold voltage section in response to the first voltage and the third temperature element is a transistor.

The comparison unit can include a differential amplifier.

The temperature sensing circuit can further comprise a temperature sensing control unit configured to receive a first enable signal and a period signal and to generate a second enable signal for enabling the temperature sensing unit and the comparison unit every period of the period signal. The temperature sensing control unit can generate a counter pulse for sampling the temperature detecting signal.

The temperature sensing circuit can further comprise a flag signal generating unit for sampling the temperature detecting signal in response to the counter pulse and generating a flag signal having temperature information, wherein the flag signal is enabled when the sampled temperature detecting signal is enabled at least once.

The temperature sensing circuit can further comprise a temperature sensing control unit which includes first a logic element for performing a first logic operation to a first enable signal and a period signal, a delay unit for generating a second enable signal, which is enabled every period of the period signal, by delaying an output signal of the first logic element, and a logic unit for generating a counter pulse for sampling the temperature detecting signal by performing a second logic operation to an output signal of the logic element and a signal which is produced by delaying the output signal of the logic element.

The temperature sensing circuit can further comprise a flag signal generating unit which has a counting unit to receive the temperature detecting signal and generate a plurality of counting signals in response to the counter pulse, and a signal processing unit configured to receive the plurality of counting signals and then generate a flag signal having temperature information, wherein the flag signal is enabled when all of the counting signals are enabled. The counting unit is initialized in response to the first enable signal.

In another aspect of the present invention, a semiconductor memory device comprises a sensing circuit including a temperature sensing unit for generating a reference voltage having a constant level, regardless of a temperature fluctuation, and a variable voltage to be changed according to the temperature fluctuation, a comparison unit for comparing the reference voltage to the variable voltage, detecting an ambient temperature and generating a temperature detecting signal, and a control circuit for performing a control operation based on temperature information in the temperature detecting signal. The control circuit can control a self refresh operating period by using the temperature information.

As compared to a conventional temperature sensing circuit having a large number of operational amplifiers, the temperature sensing circuit according to the present invention can reduce chip size and current consumption.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF EXEMPLARY EMBODIMENTS

Hereinafter, the present invention will be described in detail through exemplary embodiments and examples. The exemplary embodiments merely exemplify the present invention, and the scope of the present invention and the claims appended hereto is not limited by them.

Figure 1:
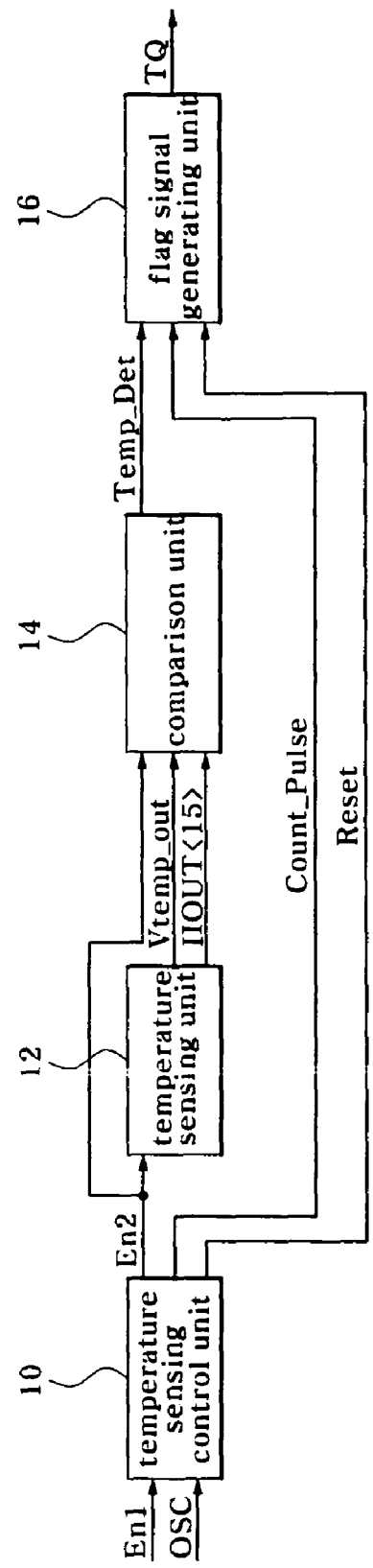
FIG. 1 is a block diagram illustrating a temperature sensing circuit according to an exemplary embodiment of the present invention.

FIG. 1 is a block diagram illustrating a constitution of a temperature sensing circuit according to an exemplary embodiment of the present invention.

As shown in FIG. 1, the temperature sensing circuit in the exemplary embodiment includes a temperature sensing control unit 10, a temperature sensing unit 12, a comparison unit 14 and a flag signal generating unit 16.

Figure 2:
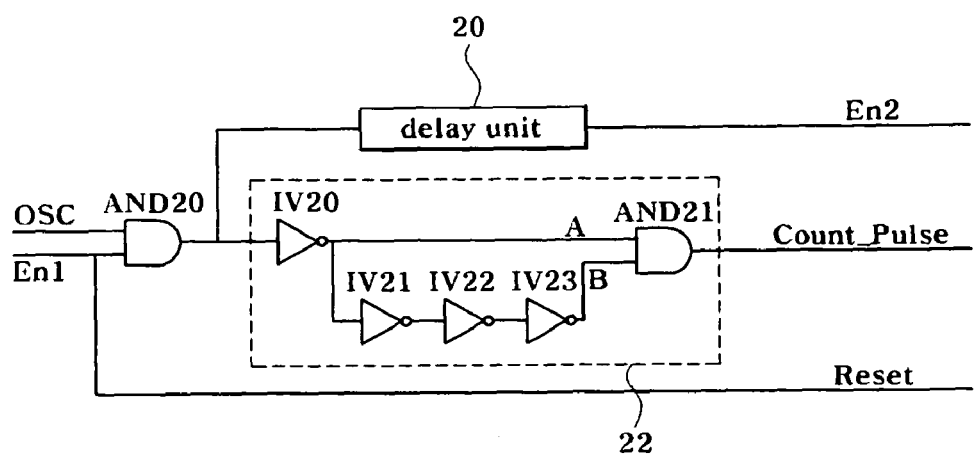
FIG. 2 is a block diagram illustrating a temperature sensing control unit of FIG. 1.

As shown in FIG. 2, the temperature sensing control unit 10 includes an AND gate AND20 configured to receive a first enable signal En1 and a period signal OSC and perform a logical AND operation, a delay unit 20 for delaying an output signal of the AND gate AND20 in a predetermined section and generating a second enable signal En2 which is enabled every period of the period signal OSC, an inverter IV20 for inverting the output signal of the AND gate AND20, an inverter chain IV21 to IV23 for delaying and inverting an output signal of the inverter IV20, and an AND gate AND21 for generating a counter pulse Count-Pulse through a logical AND operation to an output signal A of the inverter IV20 and an output signal B of the inverter chain IV21 to IV23.

Figure 3:
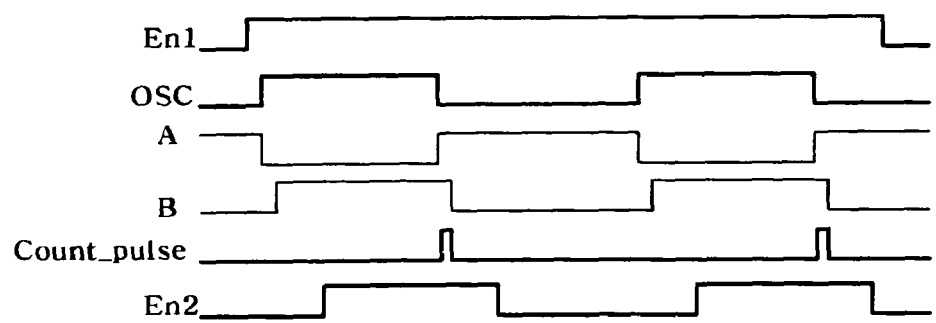
FIG. 3 is a timing chart illustrating a characteristic of input/output signals of the temperature sensing control unit of FIG. 2.

The characteristic of input/output signals of the temperature sensing control unit 10 will be described below in detail. Referring to FIG. 3, the first enable signal En1 is a signal which is enabled in a high level and enables a function to sense a high temperature and the period signal OSC is a signal which is enabled at a constant period. The second enable signal En2 is a signal which is enabled at the same period as the period signal OSC after the first enable signal En1 is enabled and which drives the temperature sensing unit 12 and the comparison unit 14. Since the signal A is an inverted signal of the period signal OSC and the signal B is generated as a delay signal of the period signal OSC in a predetermined section, the counter pulse Count-Pulse becomes a signal which is enabled in a high level in a section where the signal A is delayed by the inverter chain IV21 to IV23, that is, the counter pulse is determined by a difference between the signal A of a high level and the signal B of a low level. The counter pulse Count-Pulse is a signal for sampling a temperature detecting signal outputted from the comparison unit 14.

Figure 4:
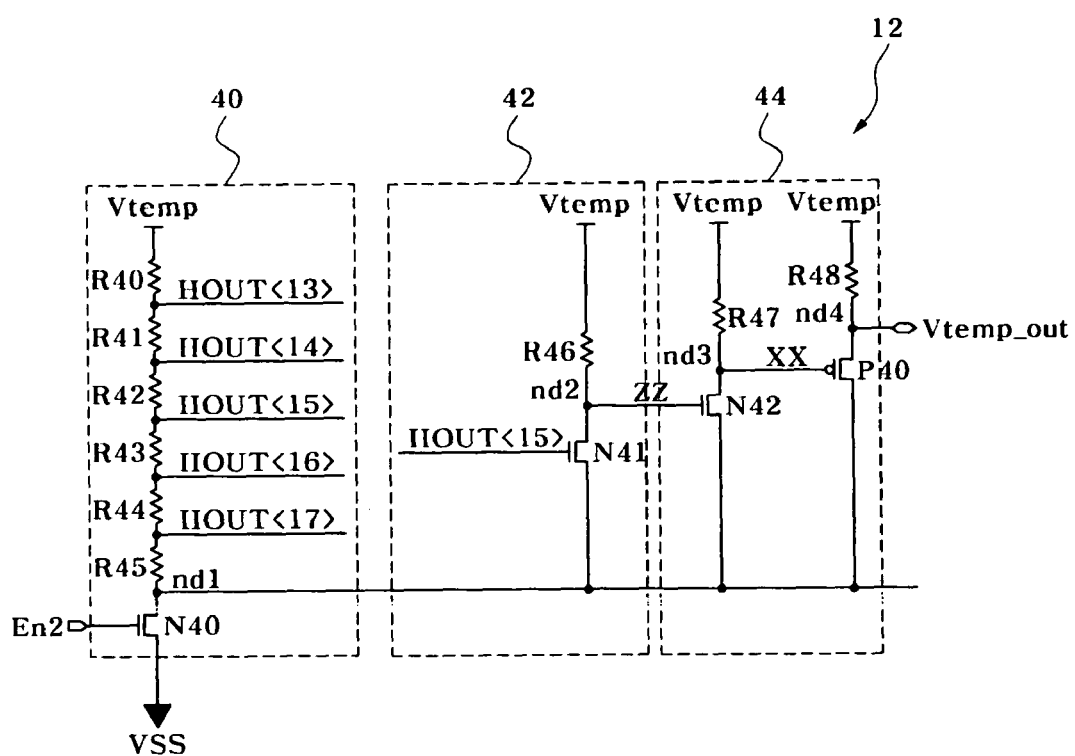
FIG. 4 is a block diagram illustrating a temperature sensing unit of FIG. 1.

Referring to FIG. 4, the temperature sensing unit 12 includes a reference voltage generating unit 40, a control voltage generating unit 42 and an amplifying unit 44. The reference voltage generating unit 40 includes a plurality of resistance elements R40 to R45 which are connected in series between a terminal for receiving a driving voltage Vtemp and a node nd1, and generates a plurality of reference signals HOUT<13:17>, and an NMOS transistor N40 which is connected between the node nd1 and a ground voltage level and is turned on in response to the second enable signal En2 so that a voltage dividing operation is performed by the resistance elements R40 to R45. Although the reference voltage generating unit 40 uses a trimming method, a command method or a metal method can be used in another example. Also, a driving voltage Vtemp can be changed into a core voltage (VCORE) in another embodiment. The reference voltage signals HOUT<13:17> have a voltage level corresponding to a variable voltage signal Vtemp_Out which is generated according to an ambient temperature. In the preferred embodiment, the reference voltage signal HOUT<15> is set to a level equal to the variable voltage signal Vtemp_Out generated when the ambient temperature is approximately 90° C.

The control voltage generating unit 42 includes a resistance element R46 connected between the terminal for receiving the driving voltage Vtemp and a node nd2, and an NMOS transistor N41 connected between the node nd2 and the node nd1 to control a first gate voltage ZZ in response to the reference signal HOUT<15>. A MOS transistor can be used instead of the resistance element R46 in another embodiment.

The amplifying unit 44 includes a resistance element R47 connected between the terminal for receiving the driving voltage Vtemp and a node nd3, an NMOS transistor N42 connected between the node nd3 and the node nd1 to control a second gate voltage XX in response to the first gate voltage ZZ, a resistance element R48 connected between the terminal for receiving the driving voltage Vtemp and a node nd4, and a PMOS transistor P40 connected between the node nd4 and the node nd1 to control a level of the variable voltage Vtemp_Out in response to the second gate voltage XX. Here, the first gate voltage ZZ is applied to the NMOS transistor N42 which operates in a subthreshold voltage section. The subthreshold voltage section is a section in which a gate voltage applied to a MOS transistor is below a threshold voltage Vth. Here, it is desirable to use a long channel MOS transistor for the NMOS transistor N42 and MOS transistors can be used instead of the resistance elements R47 and R48 in another embodiment of the present invention.

The comparison unit 14 receives the reference voltage signal HOUT<15> and the variable voltage signal Vtemp_Out and generates a temperature detecting signal TEMP_DET which is enabled in a high level when the variable voltage signal Vtemp_Out is lower than the reference voltage signal HOUT<15>. The comparison unit 14 can be a typical differential amplifier circuit.

Figure 5:
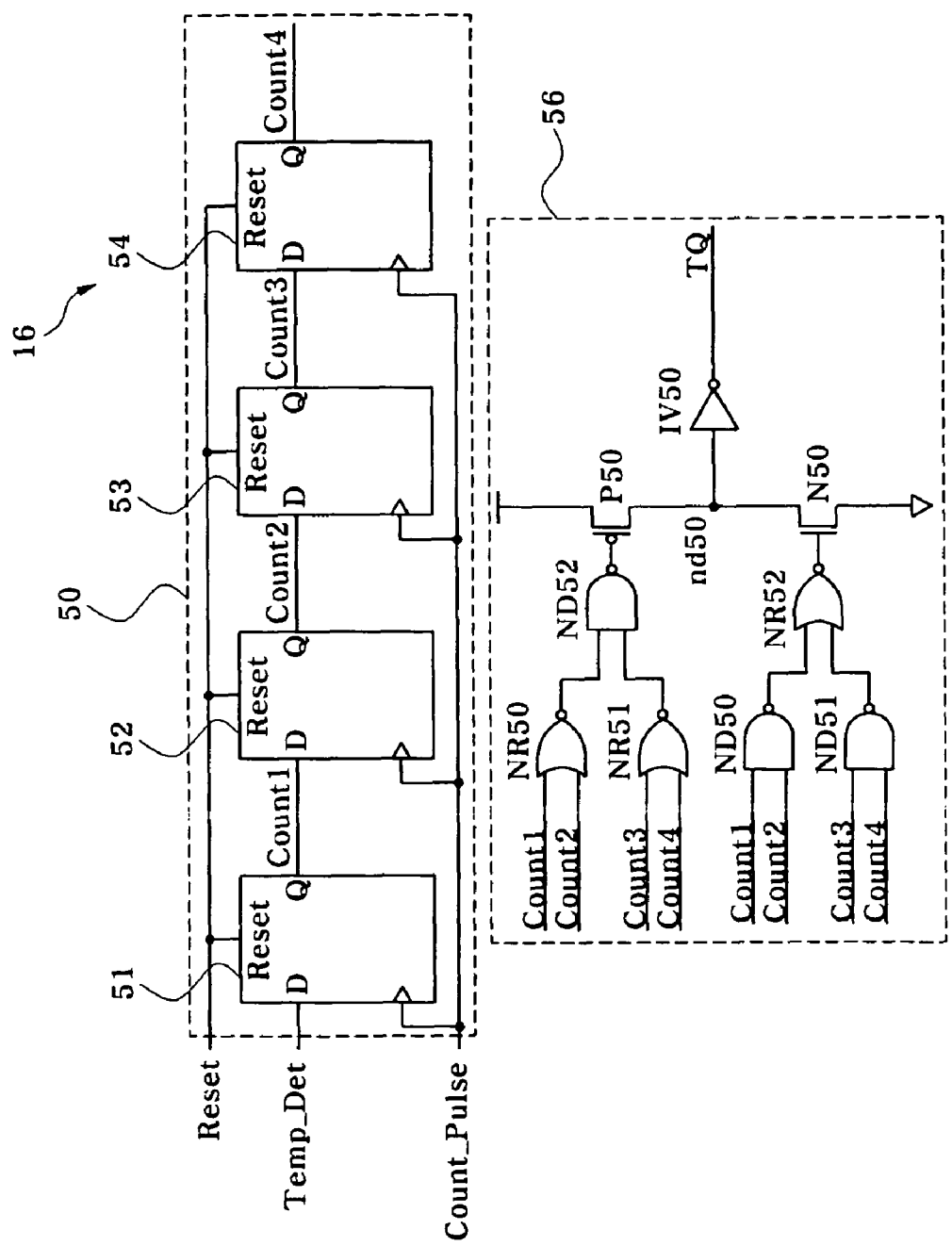
FIG. 5 is a block diagram illustrating a flag signal generating unit of FIG. 1.

Referring to FIG. 5, the flag signal generating unit 16 includes a counter unit 50 and a signal processing unit 56. The counter unit 50 includes first to fourth flip-flops 51 to 54 which are connected in series to each other, count the temperature detecting signal Temp_Det sequentially in response to the counter pulse Count-Pulse and generate first to fourth counting signals Count1 to Count4, respectively. The first to fourth flip-flops 51 to 54 are initialized by a reset signal Reset.

The signal processing unit 56 includes NOR gates NR50 and NR51 and a NAND gate ND52 to generate a pull-up signal of a low level which turns on a PMOS transistor P50 when the first to fourth counting signals Count1 to Count4 are all in a low level. The signal processing unit 56 also includes NAND gates ND50 and ND51 and a NOR gate NR52 to generate a pull-down signal of a high level which turns on an NMOS transistor N50 when the first to fourth counting signals Count1 to Count4 are all in a high level, and an inverter IV50 inverting a signal on a node nd50 to generate a high temperature flag signal TQ having temperature information.

The operation of the temperature sensing circuit will be described below referring to FIGS. 6 to 9.

First, as described above, the temperature sensing control unit 10 receives the first enable signal En1 and the period signal OSC and generates the second enable signal En2, which is enabled at the same period as the period signal OSC after the first enable signal En1 is enabled, and the temperature sensing control unit 10 also generates the counter pulse Count-Pulse for sampling the temperature detecting signal Temp_Det outputted from the comparison unit 14. Also, the temperature sensing control unit 10 outputs a reset signal Reset by bypassing the first enable signal En1.

Next, the temperature sensing unit 12 is driven in response to the second enable signal En2 and generates the reference voltage HOUT<13:17> having a constant level in spite of the temperature fluctuation and the variable voltage Vtemp_Out which varies according to the temperature fluctuation. Hereafter, a process of generating the reference voltage signals HOUT<13:17> and the variable voltage Vtemp_Out will be described in detail.

The reference voltage generating unit 40 divides the driving voltage Vtemp and generates the reference voltage signals HOUT<13:17>. The reference voltage signals HOUT<13:17> are produced by dividing the driving voltage Vtemp using the plurality of passive resistance elements, such as the resistors R40 to R45, and are generated in a constant level since a level change is not big according to fluctuation of the ambient temperature. A level of the reference voltage signal HOUT<15> generated in one embodiment of the present invention is the same as that of the variable voltage signal Vtemp_Out which is generated when the ambient temperature is 90° C.

The control voltage generating unit 42 divides the driving voltage Vtemp in the proportion of a turn-on resistance value of the resistance element R46 and the resistance value of the NMOS transistor N41 and then generates the first gate voltage signal ZZ. Here, the first gate voltage signal ZZ is generated in a level which is below the threshold voltage (Vth) of the NMOS transistor N42 so that the NMOS transistor N42 can operate in the subthreshold section.

Figure 6:
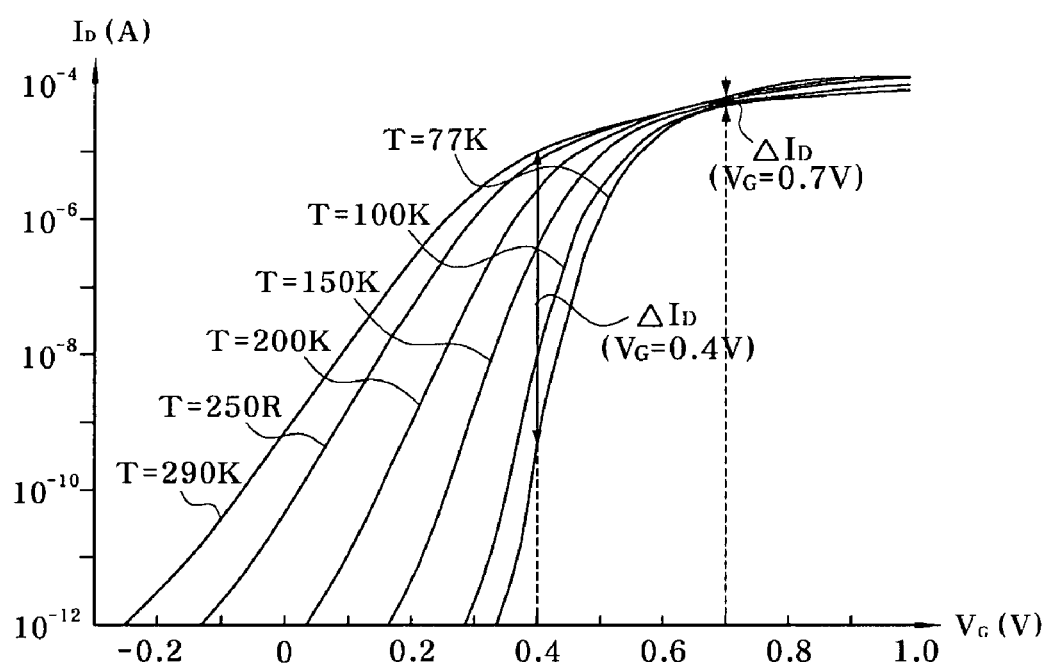
FIG. 6 is a graph showing a change of a drain current of a MOS transistor in a subthreshold voltage section according to fluctuation of temperature.
Figure 7:
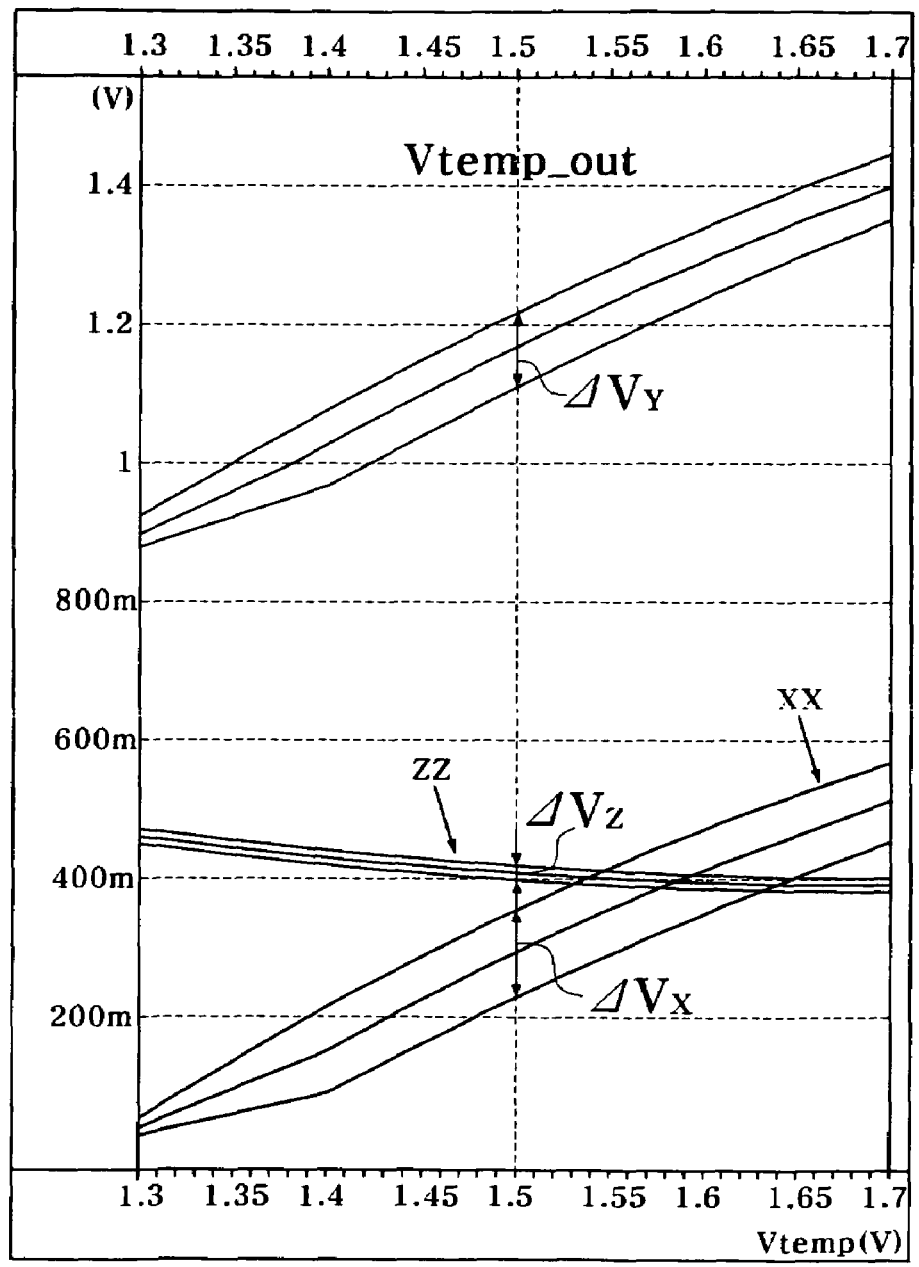
FIG. 7 is a graph showing an operation of the temperature sensing unit of FIG. 4.

The amplifying unit 44 divides the driving voltage Vtemp in the proportion of a turn-on resistance value of the resistance element R47 and the resistance value of the NMOS transistor N42 and then generates the second gate voltage XX. Referring to FIG. 6, the change in the drain current $I_D$, which is caused by the temperature fluctuation, is big in the subthreshold section of the MOS transistor. For example, when the gate voltage $V_G$ is 0.4 V, the change of the drain current $I_D$ becomes $\Delta I_D$, and this change of the drain current is much bigger than that in the section where the gate voltage $V_G$ is more than 0.7 V. Therefore, as shown in FIG. 7, the second gate voltage XX, which is generated by the NMOS transistor N42 operating in the subthreshold voltage section, has a big potential difference $\Delta V_X$ according to the temperature. Also, as shown in FIG. 7, the amplifying unit 44 amplifies the second gate voltage XX in a level of the driving voltage Vtemp and generates the variable voltage signal Vtemp_Out having a big potential difference $\Delta V_Y$ according to the temperature. At this time, the amplifying unit 44 generates the variable voltage Vtemp_Out by dividing the driving voltage Vtemp in the proportion of a turn-on resistance value of the resistance element R48 to the resistance value of the PMOS transistor P40.

Figure 8:
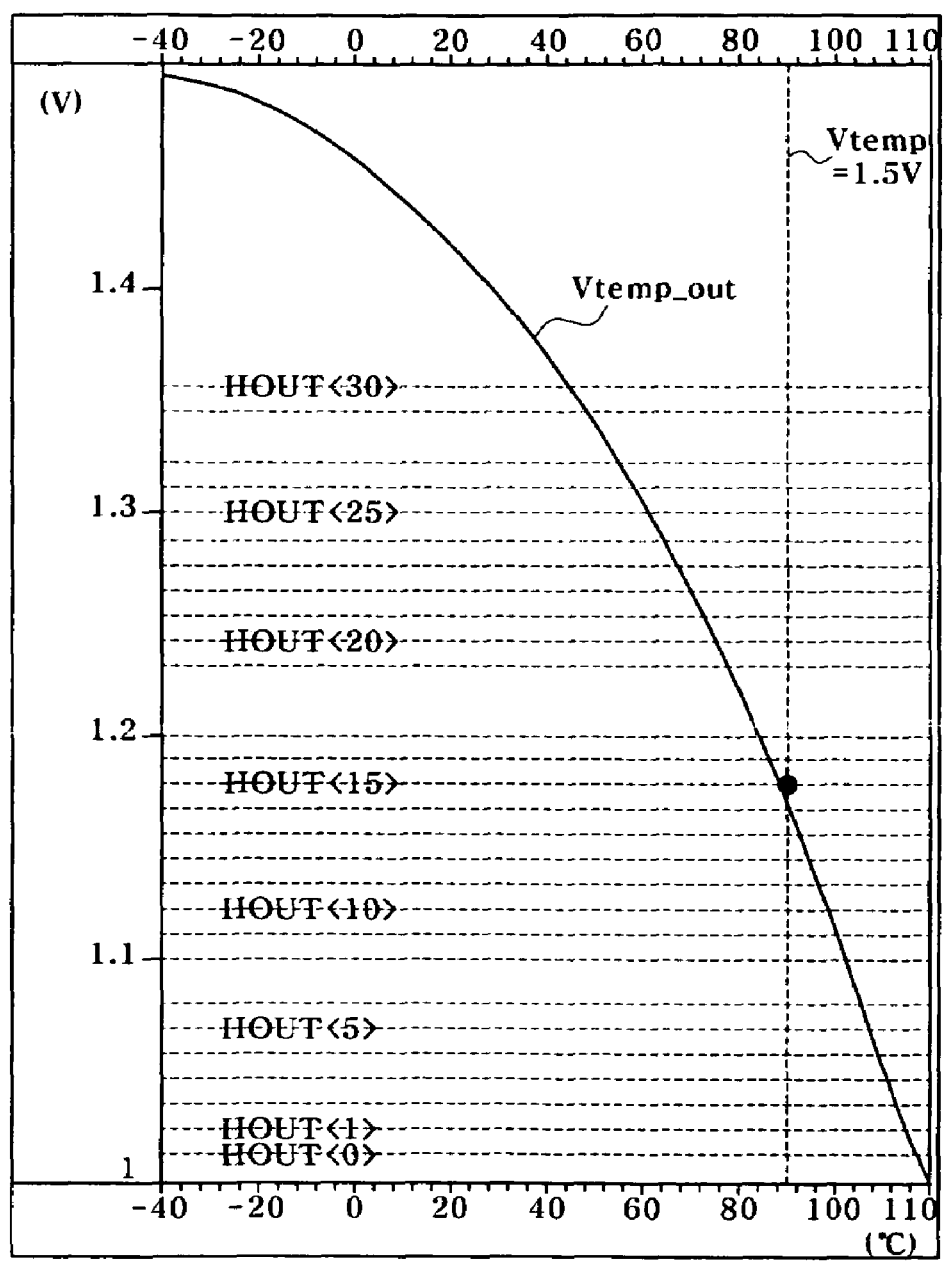
FIG. 8 is a graph showing an operation of a comparison unit of FIG. 1.

Next, the comparison unit 14 compares the reference voltage signal HOUT<15>to the variable voltage signal Vtemp_Out and generates the temperature detecting signal Temp_Det. More specifically, the comparison unit 14 includes a differential amplifier circuit and generates and outputs the temperature detecting signal Temp_Det of a low level in case that the variable voltage signal Vtemp_Out is higher than the reference voltage signal HOUT<15>, and generates and outputs the temperature detecting signal Temp_Det of a high level in case that the variable voltage signal Vtemp_Out is lower than the reference voltage signal HOUT<15>. Here, the level of the variable voltage signal Vtemp_Out decreases as the temperature rises and the reference voltage signal HOUT<15> has a level which is the same as that of the variable voltage signal Vtemp_Out generated when the ambient temperature is 90° C. Thus, as shown in FIG. 8, in case that the variable voltage signal Vtemp_Out is lower than the reference voltage signal HOUT<15> when the driving voltage Vtemp is 1.5 V, the temperature detecting signal Temp_Det is generated in a high level, meaning that the ambient temperature is more than 90° C.

Figure 9:
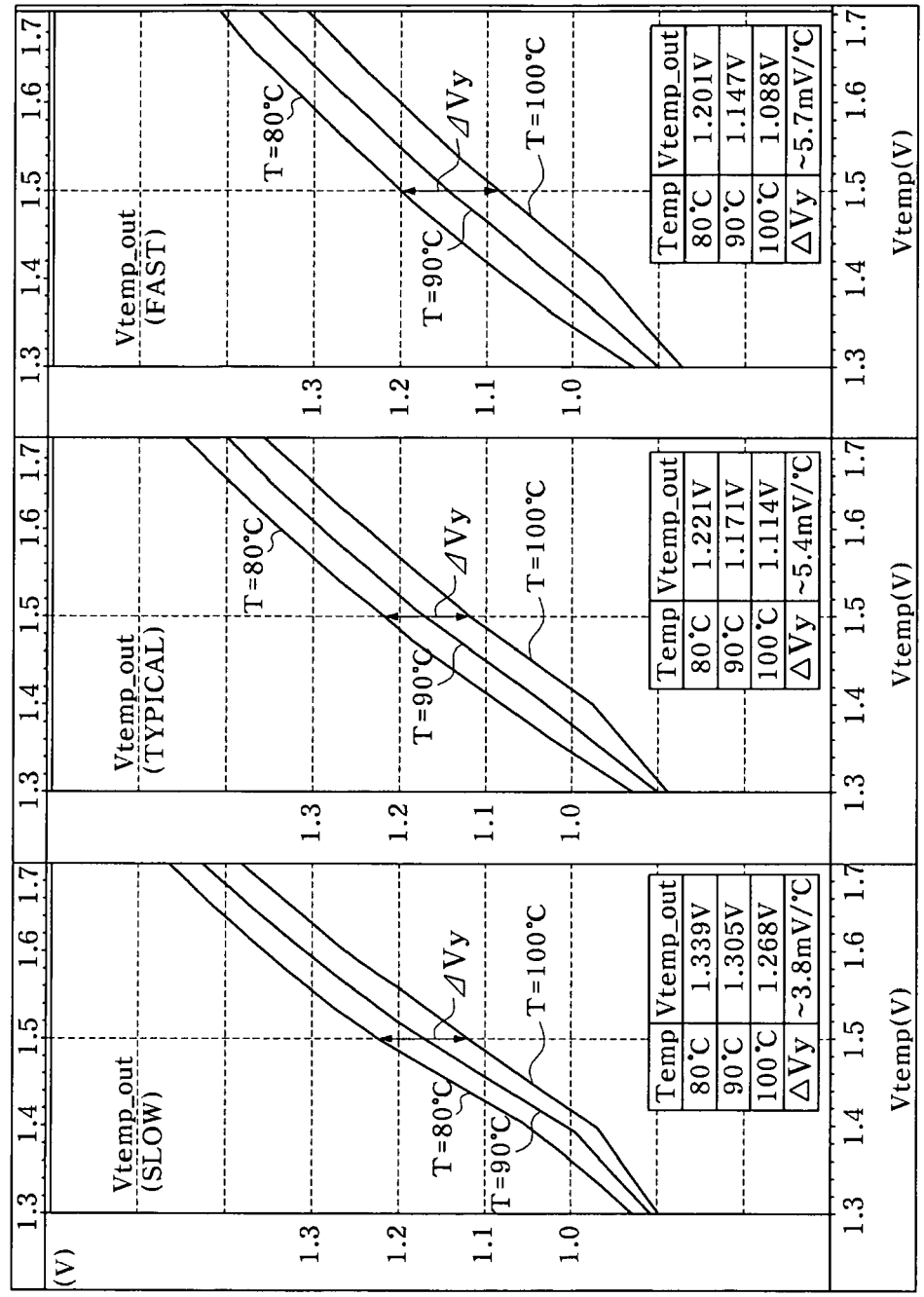
FIG. 9 is a graph showing a potential difference per temperature of a temperature detecting signal according to change of PVT characteristic.

Accordingly, the comparison unit 14 compares the variable voltage Vtemp_Out to the reference voltage signal HOUT<15> and generates the temperature detecting signal Temp_Det which is enabled in a high level when the ambient temperature is high. It is important to constantly maintain the potential difference $\Delta V_Y$, according to temperature, in the variable voltage signal Vtemp_Out according to the PVT characteristics in order to stably generate the temperature detecting signal Temp_Det. Referring to FIG. 9, it can be confirmed that the potential difference $\Delta V_Y$ of the temperature detecting signal Temp_Det is constantly maintained despite change of a skew characteristic from the PVT characteristics. The skew characteristic is a current characteristic of a transistor. "Typical" refers to a group in which the current characteristic is within the range of what a manufacturer requires, "Slow" refers to a group in which the current characteristic is lower than the transistor belonging to "Typical," and "Fast" refers to a group in which the current characteristic is higher than the transistor belonging to "Typical."

Next, the flag signal generating unit 16 detects the temperature detecting signal Temp_Det in response to the counter pulse Count-Pulse and generates the high temperature flag signal TQ including temperature information. More specifically, the first to fourth flip-flops 51 to 54 of the counter unit 50 sample the temperature detecting signal Temp_Det every time the counter pulse Count-Pulse is enabled in a high level, and generate the first to fourth counting signals Count1 to Count4, respectively. Here, the first to fourth counting signals Count1 to Count4 are formed in a level equal to the temperature detecting signal Temp_Det, which is inputted in response to the counter pulse Count-Pulse, and the high temperature flag signal TQ is in a high level in case that the first to fourth counting signals Count1 to Count4 are all in a high level. Thus, the high temperature flag signal TQ of a high level means that each temperature detecting signal Temp_Det sampled sequentially in response to the counter pulse Count-Pulse is in a high level. That is, the temperature sensing circuit according to the present invention secures an accuracy of the function to sense a high temperature by generating and outputting the high temperature flag signal TQ of a high level only in case that the temperature detecting signal of a high level, meaning that the ambient temperature is more than 90° C., is inputted successively more than four times. Such a high temperature flag signal TQ, the accuracy of which is secured, is used in a refresh period control circuit for controlling an operational period to reduce current consumption in a self refresh mode.

Figure 10:
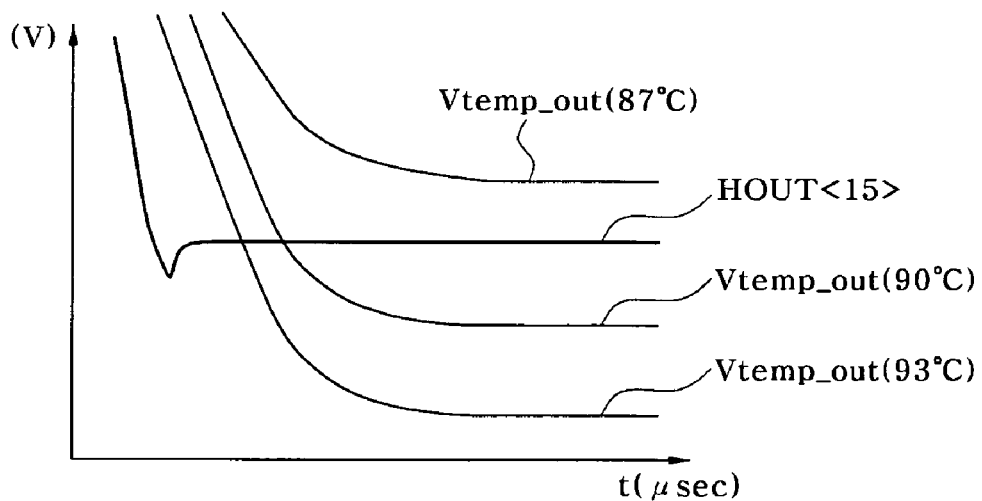
FIG. 10 is a timing chart illustrating an operation of the temperature sensing circuit of FIG. 1.
Figure 10:
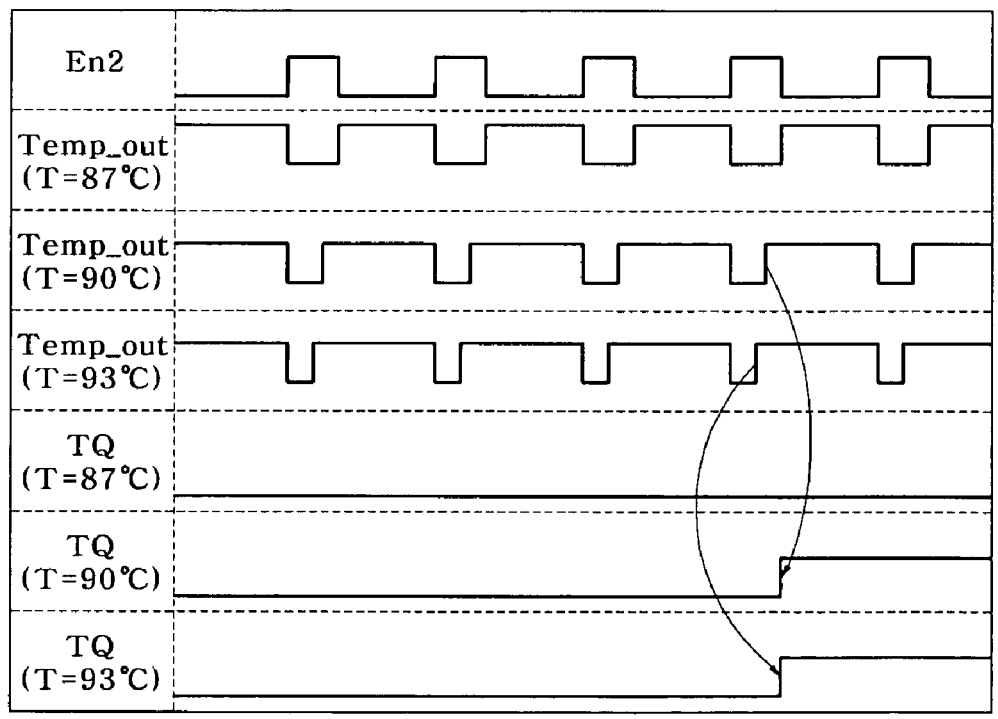

Hereafter, the operation of the temperature sensing circuit of the present invention will be summarized referring to FIG. 10. As shown in FIG. 10, the level of the variable voltage signal Vtemp_Out becomes lower according to a higher temperature. That is, in case that the ambient temperature is 87° C., the level of the variable voltage signal Vtemp_Out is higher than the reference voltage signal HOUT<15> but in case that the ambient temperature is more than 90° C., the level of the variable voltage signal Vtemp_Out is lower than the reference voltage signal HOUT<15>. Therefore, if the ambient temperature is more than 90° C., the level of the variable voltage Vtemp_Out becomes lower than the reference voltage signal HOUT<15>, thereby enabling the temperature detecting signal Temp_Det in a high level. In case that the temperature detecting signal Temp_Det of a high level is generated successively more than four times, since the accuracy of the information that the ambient temperature is more than 90° C. is reliable, the high temperature flag signal TQ of a high level is generated (and, for example, provided to a refresh period control circuit. Upon reviewing a simulation result of FIG. 10, it is confirmed that the temperature sensing circuit of the present invention has a resolution of 3° C.

Although it is described that the temperature sensing circuit according to the present invention is used for providing temperature information on whether the ambient temperature is more than 90° C., it can be adapted to be used for detecting various ambient temperatures (such as in a range of −40° C. to 120° C.).

While the present invention has been described with respect to the particular embodiments, it will be apparent to those skilled in the art that various changes and modifications may be made without departing from the spirit and scope of the invention as defined in the following claims.

The present application is based on and claims priority to Korean application number 10-2007-0049358, filed on May 21, 2007, which is incorporated herein by reference in its entirety.

What is claimed is:

1. A temperature sensing circuit comprising
   a temperature sensing unit for generating a reference voltage having a constant level, regardless or a temperature fluctuation, and a variable voltage to be changed according to the temperature fluctuation; and
   a comparison unit for comparing the reference voltage to the variable voltage, detecting an ambient temperature and generating a temperature detecting signal,
   wherein the temperature sensing unit comprises
      a plurality of voltage dividing elements connected in series between a driving voltage supply terminal for receiving the driving voltage and a first node,
      an enable element connected between the first node and a ground voltage level in order to enable an operation of the voltage dividing elements in response to a first enable signal,
      a control voltage generating unit for generating a first voltage in response to the reference voltage, the control voltage generating unit including a first level controlling element connected between the driving voltage supply terminal and a second node, and
      a first temperature element connected between the first node and the second node to generate the first voltage in response to the reference voltage, and
      an amplifying unit for generating the variable voltage in response to the first voltage.

2. The temperature sensing circuit of claim 1, wherein the amplifying unit includes:
   a second level controlling element connected between the driving voltage supply terminal and a third node; and
   a second temperature element connected between the first node and the third node to generate the variable voltage in response to the first voltage.

3. The temperature sensing circuit of claim 1, wherein the amplifying unit includes:
   a second level controlling element connected between the driving voltage supply terminal and a third node;
   a second temperature element connected between the first node and the third node and generating a second voltage in response to the first voltage;
   a third level controlling element connected between the driving voltage supply terminal and a fourth node; and
   a second temperature element connected between the first node and the fourth node to generate the variable voltage in response to the second voltage.

4. The temperature sensing circuit of claim 1, wherein the comparison unit includes a differential amplifier.

5. The temperature sensing circuit of claim 1, further comprising a temperature sensing control unit configured to receive a first enable signal and a period signal and generate a second enable signal for enabling the temperature sensing unit and the comparison unit every period of the period signal.

6. The temperature sensing circuit of claim 5, wherein the temperature sensing control unit generates a counter pulse for sampling the temperature detecting signal.

7. The temperature sensing circuit of claim 6, further comprising a flag signal generating unit for sampling the temperature detecting signal in response to the counter pulse and generating a flag signal having temperature information, wherein the flag signal is enabled when the sampled temperature detecting signal is enabled at least once.

8. The temperature sensing circuit of claim 1, further comprising a temperature sensing control unit which includes:
- a first logic element for performing a first logic operation to a first enable signal and a period signal;
- a delay unit for generating a second enable signal, which is enabled every period of the period signal, by delaying an output signal of the first logic element; and
- a logic unit for generating a counter pulse for sampling the temperature detecting signal by performing a second logic operation to an output signal of the first logic element and another signal which is produced by delaying the output signal of the first logic element.

9. The temperature sensing circuit of claim 8, further comprising:
- a flag signal generating unit including a counting unit configured to receive the temperature detecting signal and generate a plurality of counting signals in response to the counter pulse; and
- a signal processing unit configured to receive the plurality of counting signals and then generate a flag signal having temperature information therein, wherein the flag signal is enabled when all of the plurality of counting signals are enabled.

10. The temperature sensing circuit of claim 9, wherein the counting unit is initialized in response to the first enable signal.

* * * * *